(12) United States Patent
Nagafuji et al.

(10) Patent No.: US 8,644,660 B2
(45) Date of Patent: Feb. 4, 2014

(54) OPTO-ELECTRIC HYBRID BOARD AND MANUFACTURING METHOD THEREFOR

(75) Inventors: Akiko Nagafuji, Ibaraki (JP); Yuichi Tsujita, Ibaraki (JP); Masayuki Hodono, Ibaraki (JP); Masami Inoue, Ibarkai (JP)

(73) Assignee: Nitto Denko Corporation, Ibaraki-shi (JP)

( * ) Notice: Subject to any disclaimer, the term of this patent is extended or adjusted under 35 U.S.C. 154(b) by 154 days.

(21) Appl. No.: 13/409,422

(22) Filed: Mar. 1, 2012

(65) Prior Publication Data

US 2012/0251055 A1 Oct. 4, 2012

Related U.S. Application Data

(60) Provisional application No. 61/473,545, filed on Apr. 8, 2011.

(30) Foreign Application Priority Data

Mar. 28, 2011 (JP) ................. 2011-071078

(51) Int. Cl.
*G02B 6/26* (2006.01)
*G02B 6/36* (2006.01)
*G02B 6/42* (2006.01)
*G02B 6/10* (2006.01)

(52) U.S. Cl.
USPC .............. 385/31; 385/39; 385/52; 385/129; 385/130; 385/132; 264/1.24; 264/1.25; 29/592

(58) Field of Classification Search
USPC ......... 385/31, 39, 52, 88, 129–130, 132, 134, 385/136, 139; 264/1.24–1.25; 29/592, 830; 72/362

See application file for complete search history.

(56) References Cited

U.S. PATENT DOCUMENTS

2002/0181882 A1 * 12/2002 Hibbs-Brenner et al. ...... 385/52

FOREIGN PATENT DOCUMENTS

JP 5-196831 A 8/1993
JP 2009-223063 A 10/2009

* cited by examiner

*Primary Examiner* — Uyen Chau N Le
*Assistant Examiner* — Michael Mooney
(74) *Attorney, Agent, or Firm* — Westerman, Hattori, Daniels & Adrian, LLP

(57) ABSTRACT

Provided are an opto-electric hybrid board and a manufacturing method. The opto-electric hybrid board includes an optical waveguide unit and an electric circuit unit having an optical element mounted thereon. The optical waveguide unit includes socket portions for locating the electric circuit unit, which are formed on a surface of an undercladding layer and formed of the same material as a core. The socket portions are located at predetermined locations with respect to one end surface of a core. The electric circuit unit includes bent portions which are formed by bending a part of an electric circuit board so as to stand, for fitting into the socket portions. The bent portions are located at predetermined locations with respect to the optical element. The optical waveguide unit and the electric circuit unit are coupled in a state in which the bent portions fit into the socket portions.

4 Claims, 9 Drawing Sheets

OPTO-ELECTRIC HYBRID BOARD AND MANUFACTURING METHOD THEREFOR

RELATED APPLICATIONS

This application claims the benefit of U.S. Provisional Application No. 61/473,545 filed on Apr. 8, 2011, which is hereby incorporated by reference.

BACKGROUND OF THE INVENTION

1. Field of the Invention

The present invention relates to an opto-electric hybrid board which includes an optical waveguide unit and an electric circuit unit having an optical element mounted thereon, and to a manufacturing method therefor.

2. Description of the Related Art

In recent electronic devices or the like, as the amount of transmission information increases, in addition to electric wiring, optical wiring is adopted. More specifically, an opto-electric hybrid board including an electric circuit unit in which an optical element such as a light-emitting element for converting an electrical signal into an optical signal or a light-receiving element for converting an optical signal into an electrical signal is mounted on an electric circuit board having electric wiring formed thereon, and an optical waveguide unit in which an optical waveguide as optical wiring for transmitting the optical signal is formed is incorporated in the electronic device or the like.

In the opto-electric hybrid board, light which is emitted from the light-emitting element is required to enter one end surface (light entrance) of a core (optical wiring) of the optical waveguide unit, and light which exits the other end surface (light exit) of the core is required to be received by the light-receiving element. Therefore, it is necessary that the optical element (the light-emitting element or the light-receiving element) and the core be aligned with each other.

Accordingly, methods of aligning the optical element and the core are conventionally proposed. In an exemplary method, an optical waveguide unit is fixed and, in a state in which light is emitted from a light-emitting element to one end surface (light entrance) of a core of the optical waveguide unit while the location of the light-emitting element is changed, the intensity of light which exits from the other end surface (light exit) of the core is monitored, and the location at which the intensity becomes the highest is determined as the alignment location (see JP-A1-HEI5 (1993)-196831). In another exemplary method, a connector having holes for locating formed therein is attached to an optical waveguide unit, pins for locating, which fit into the holes, are attached to an electric circuit unit, and, by fitting the pins into the holes, respectively, an optical element and a core of the optical waveguide unit are automatically aligned (see Patent JP-A1-2009-223063).

However, in the aligning method described in JP-A1-HEI5 (1993)-196831 above, although alignment with high accuracy is possible, it takes time and effort, and thus, the method lacks mass-productivity. Further, in the aligning method described in JP-A1-2009-223063 above, although position adjustment may be carried out in a simple method of fitting the pins into the holes, respectively, not only dimensional deviations are caused when the connector and the pins are respectively manufactured but also misalignment of the attachment location of the connector with respect to the optical waveguide unit, misalignment of the attachment location of the pins for locating with respect to the electric circuit unit, and the like are caused. Accumulation of those dimensional deviations and misalignments lowers the accuracy of the alignment. If enhancement of the accuracy of the alignment is attempted, control of the dimensional accuracy is necessary so that the dimensional deviations and misalignments are not caused, and thus the cost increases and the method lacks mass-productivity.

SUMMARY OF THE INVENTION

An opto-electric hybrid board is provided which eliminates the necessity of an aligning operation of a core of an optical waveguide unit and an optical element of an electric circuit unit and which is excellent in mass-productivity. A manufacturing method therefor is also provided.

An opto-electric hybrid board is provided, including: an optical waveguide unit; and an electric circuit unit having an optical element mounted thereon, the electric circuit unit being coupled to the optical waveguide unit, in which: the optical waveguide unit includes: an undercladding layer; and a core for an optical path and a socket portion for locating the electric circuit unit, which are formed on a surface of the undercladding layer, the socket portion being formed of the same material as a forming material for the core; the electric circuit unit includes: an electric circuit board; the optical element mounted at a predetermined portion on the electric circuit board; and a bent portion formed by bending a part of the electric circuit board so as to stand upright, for fitting into the socket portion; the socket portion of the optical waveguide unit is located at a predetermined location with reference to a location at which the core is formed with respect to one end surface of the core; the socket portion is formed in a manner capable of nipping; the bent portion of the electric circuit unit is located and formed at a predetermined location with respect to the optical element; and the optical waveguide unit and the electric circuit unit are coupled to each other in a state in which the bent portion of the electric circuit unit fits into the socket portion of the optical waveguide unit.

Further, there is provided a manufacturing method for an opto-electric hybrid board as described above in which an optical waveguide unit and an electric circuit unit having an optical element mounted thereon are coupled, the method including: manufacturing the optical waveguide unit including: forming an undercladding layer; and forming, on a surface of the undercladding layer, a core for an optical path and a socket portion for locating the electric circuit unit, the forming of the core and the socket portion including forming, by photolithography, the socket portion for locating the electric circuit unit simultaneously with the forming of the core, the socket portion being formed of the same material as a forming material for the core at a predetermined location located with respect to one end surface of the core; manufacturing the electric circuit unit including: forming an electric circuit board; mounting the optical element at a predetermined portion on the electric circuit board; and forming, after the mounting the optical element, a bent portion for fitting into the socket portion by bending so as to stand upright at a predetermined location located with respect to the optical element; and coupling the optical waveguide unit and the electric circuit unit to manufacture the opto-electric hybrid board, the coupling including fitting the bent portion of the electric circuit unit into the socket portion of the optical waveguide unit.

In the opto-electric hybrid board, an optical waveguide unit and an electric circuit unit having an optical element mounted thereon are coupled to each other. In the optical waveguide unit, one end surface of a core and a socket portion for locating the electric circuit unit are in a positional relationship of being located with respect to each other on a surface of an undercladding layer. Further, in the electric circuit unit, the optical element and the bent portion which fits into the socket portion of the optical waveguide unit are in a positional relationship of being located with respect to each other. Therefore, in a state in which the bent portion of the electric circuit unit fits into the socket portion of the optical waveguide unit, that is, in a state in which the optical waveguide unit and the electric circuit unit are coupled to each other, the core of the optical waveguide unit and the optical element of the electric circuit unit are automatically aligned. In addition, the socket portion of the optical waveguide unit is formed of the same material as the forming material for the core on a surface of the undercladding layer which forms the optical waveguide unit, while the bent portion of the electric circuit unit is formed in the electric circuit board which forms the electric circuit unit. Therefore, an additional component such as a connector is not provided for fitting the bent portion into the socket portion. Therefore, in the coupling between the optical waveguide unit and the electric circuit unit, there is no accumulation of dimensional deviations and misalignments due to such additional components including a connector, and the core of the optical waveguide unit and the optical element of the electric circuit unit are aligned with high accuracy. As described above, in the opto-electric hybrid board, the core and the optical element are formed to be automatically aligned with high accuracy by a simple operation of fitting the bent portion of the electric circuit unit into the socket portion of the optical waveguide unit, and thus an aligning operation which takes time and effort is not necessary and the opto-electric hybrid board is excellent in mass-productivity. Further, an additional component such as a connector is not necessary for fitting the bent portion into the socket portion, and thus control of the dimensional accuracy of the connector or the like is not necessary. In this regard, also, the opto-electric hybrid board is excellent in mass-productivity.

In particular, in a case where the socket portion of the optical waveguide unit is formed to be a projecting portion which is substantially V-shaped in plan view and the bent portion of the electric circuit unit fits into the projecting portion in a state of being sandwiched between substantially V-shaped opposing inner wall surfaces of the projecting portion which is substantially V-shaped, the opto-electric hybrid board in an aligned state with high accuracy is obtained with a simple locating structure.

The manufacturing method for an opto-electric hybrid board is carried out by coupling an optical waveguide unit and an electric circuit unit having an optical element mounted thereon. In a step of manufacturing the optical waveguide unit, on a surface of the undercladding layer, the socket portion for locating the electric circuit unit is formed by photolithography simultaneously with the core, the socket portion being formed of the same material as the forming material for the core. Therefore, one end surface of the core and the socket portion are in a positional relationship of being located with respect to each other. Further, in a step of manufacturing the electric circuit unit, a bent portion which fits into the socket portion of the optical waveguide unit is formed at a predetermined location which is located with respect to the optical element. Therefore, by fitting the bent portion of the electric circuit unit into the socket portion of the optical waveguide unit to couple the optical waveguide unit and the electric circuit unit, the core of the optical waveguide unit and the optical element of the electric circuit unit may be automatically aligned. In addition, the socket portion of the optical waveguide unit is formed on the surface of the undercladding layer which forms the optical waveguide unit simultaneously with the core by photolithography, while the bent portion of the electric circuit unit is formed in a part of an electric circuit board which forms the electric circuit unit. Therefore, an additional component such as a connector is not necessary for the purpose of fitting the bent portion into the socket portion. Therefore, in the coupling between the optical waveguide unit and the electric circuit unit, there is no accumulation of dimensional deviations and misalignments due to such an additional component including a connector, and the core of the optical waveguide unit and the optical element of the electric circuit unit are aligned with high accuracy. As described above, in the manufacturing method for an opto-electric hybrid board, the core and the optical element are automatically aligned with high accuracy by a simple operation of fitting the bent portion of the electric circuit unit into the socket portion of the optical waveguide unit. Therefore, an aligning operation which takes time and effort is not necessary and the method is excellent in mass-productivity. Further, an additional component such as a connector is not necessary for fitting the bent portion into the socket portion, and thus control of the dimensional accuracy of the connector or the like is not necessary. In this regard, also, the method is excellent in mass-productivity.

In particular, in a case where the socket portion of the optical waveguide unit is formed to be a projecting portion which is substantially V-shaped in plan view and the bent portion of the electric circuit unit is caused to be sandwiched between substantially V-shaped opposing inner wall surfaces of the projecting portion, which is substantially V-shaped, to be fitted into the projecting portion, the bent portion may fit into the socket portion (projecting portion) easily, and thus the method is more excellent in productivity.

DETAILED DESCRIPTION OF THE INVENTION

Next, embodiments of the present invention are described in detail with reference to the drawings.

Figure 1:
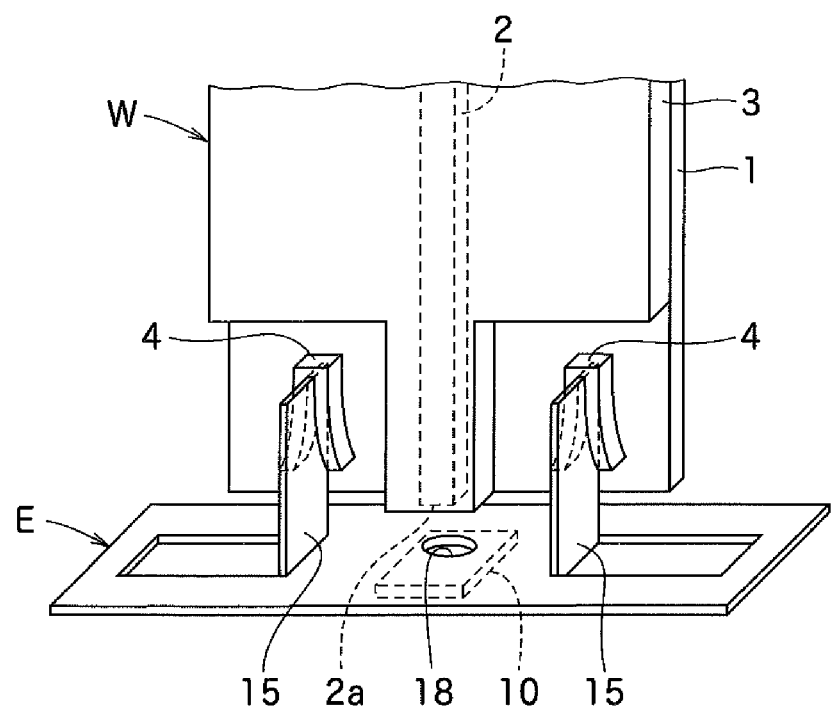
FIG. 1 is a perspective view schematically illustrating an embodiment of an opto-electric hybrid board.

FIG. 1 is a perspective view schematically illustrating an embodiment of an opto-electric hybrid board. In the opto-electric hybrid board, an optical waveguide unit W having socket portions 4 for locating an electric circuit unit, and an electric circuit unit E having bent portions 15 which fit into the socket portions 4, respectively, are separately manufactured, and the optical waveguide unit W and the electric circuit unit E are coupled to be integral by fitting the bent portions 15 of the electric circuit unit E into the socket portions 4 of the optical waveguide unit W, respectively. Here, in the optical waveguide unit W, the socket portions 4 are located and formed at predetermined locations with respect to one end surface (light transmitting surface) 2a of a core 2 (at locations which are set in advance so that, when the units W and E are coupled, the one end surface 2a of the optical waveguide unit W faces an optical element 10 of the electric circuit unit E). Further, in the electric circuit unit E, the bent portions 15 which fit into the socket portions 4, respectively, are located and formed at predetermined locations with respect to the optical element 10 (at locations which are set in advance so that, when the units W and E are coupled, the optical element 10 of the electric circuit unit E faces the one end surface 2a of the optical waveguide unit W). Therefore, in the opto-electric hybrid board, by fitting the bent portions 15 into the socket portions 4, respectively, the one end surface 2a of the core 2 and the optical element 10 are appropriately located in an aligned state. Note that, in FIG. 1, one end of the opto-electric hybrid board is illustrated, and a portion of the optical waveguide unit W which is not illustrated may be in the shape of a straight line or may be bent.

Figure 2:
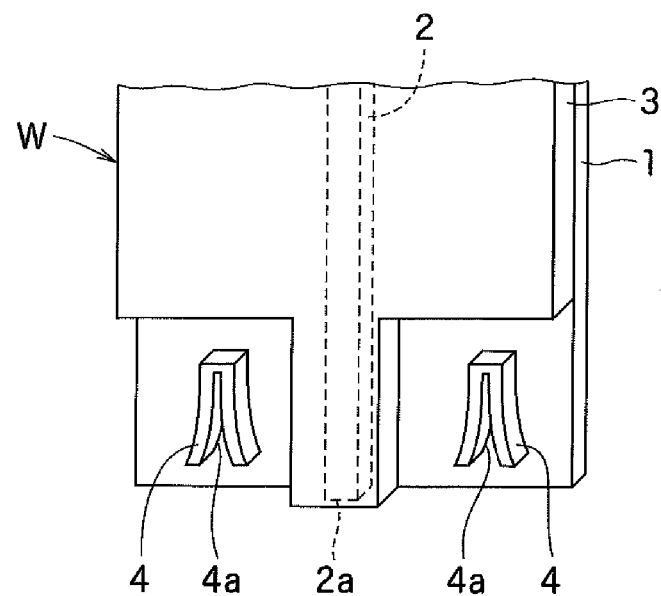
FIG. 2 is a perspective view schematically illustrating an optical waveguide unit which forms the opto-electric hybrid board.

Description is made in more detail. The optical waveguide unit W includes an undercladding layer 1, the core 2 for an optical path formed on a surface of the undercladding layer 1 in a predetermined linear pattern, and an overcladding layer 3 formed on the surface of the undercladding layer 1 so as to cover the core 2 as illustrated in FIG. 2 as a perspective view. In portions at the one end (lower end in FIG. 2) of the optical waveguide unit W on both right and left sides of the core 2, the overcladding layer 3 is, so to speak, in a notched state, from which the undercladding layer 1 is exposed. The V-shaped socket portions 4 (reverse V-shaped in FIG. 2) for locating the electric circuit unit are formed on a surface of the exposed portion. In each of the V-shaped socket portions 4, a nip portion 4a is formed by inner portions of V-shaped opposing wall portions thereof, into which the bent portion 15 (see FIG. 1) of the electric circuit unit E fits. The socket portions 4 are formed simultaneously with the core 2 of a forming material for the core 2 by photolithography, and are located and formed at predetermined locations with respect to the one end surface 2a of the core 2. In this embodiment, the socket portions 4 are formed on both right and left sides of the core 2 (in two places).

Figure 3:
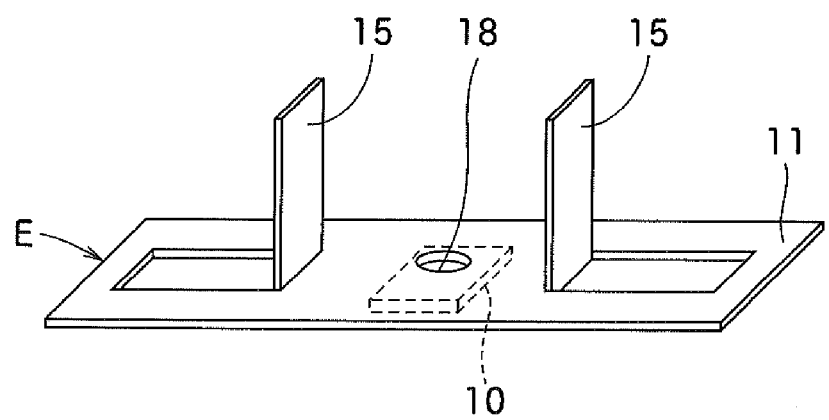
FIG. 3 is a perspective view schematically illustrating an electric circuit unit which forms the opto-electric hybrid board.

On the other hand, the electric circuit unit E includes, as illustrated in FIG. 3 as a perspective view, a substrate 11, an insulating layer (not shown) formed on a surface (lower surface in the figure) of the substrate 11, an electric circuit (not shown) including a pad for mounting an optical element formed on a surface (lower surface in the figure) of the insulating layer, and the optical element 10 mounted on the pad for mounting the optical element. Further, at a portion of the electric circuit unit E which corresponds to an optical path of the optical element 10 (over the optical element 10 in the figure), a through hole 18 for the optical path is formed. Further, in the electric circuit unit E, the bent portions 15 which fit into the socket portions 4 (see FIG. 2), respectively, of the optical waveguide unit W and which are in the shape of a rectangular plate are formed so as to stand upright from the electric circuit unit E. Each of the bent portions 15 in the shape of a rectangular plate is formed by cutting apart of stacked portion of the substrate 11 and the insulating layer so as to be U-shaped and bending a tongue portion surrounded by the U-shaped cut so as to stand upright with respect to the stacked portion, and is located and formed at a predetermined location with respect to the optical element 10. In this embodiment, the bent portions 15 are formed on both right and left sides of the optical element 10 (in two places).

Note that, on the surface of the insulating layer, there is formed an electric circuit including the pad for mounting the optical element, and further, bent portion locating circuits (not shown) used as guides when the bent portions 15 are located and formed. The bent portion locating circuits are formed along the U-shaped cuts forming the tongue portions which are to be the bent portions 15. Further, a plating layer (not shown) is formed on surfaces of the pad for mounting the optical element, the electric circuit, and the bent portion locating circuits. In this embodiment, an element of a flip chip type is used as the optical element 10, and a light-emitting portion or a light-receiving portion thereof is formed on the surface on which the optical element 10 is mounted (upper surface in the figure).

As illustrated in FIG. 1, in the opto-electric hybrid board, the optical waveguide unit W and the electric circuit unit E are coupled to be integral in a state in which the bent portions 15 of the electric circuit unit E fit into the nip portions 4a of the socket portions 4 of the optical waveguide unit W, respectively. In the fitting state, one side edge of the bent portion 15 in contact with a surface portion of the undercladding layer 1 positioned in the nip portion 4a. Here, as described above, the socket portions 4 formed in the optical waveguide unit W are located and formed at the predetermined locations with respect to the one end surface 2a of the core 2. Further, the bent portions 15 formed in the electric circuit unit E are located and formed at the predetermined locations with respect to the optical element 10. Therefore, by fitting the bent portions 15 into the socket portions 4, the one end surface 2a of the core 2 and the optical element are appropriately located in an aligned state automatically.

Further, in this embodiment, the socket portions 4 of the optical waveguide unit W are formed so as to be V-shaped. Therefore, in a state in which each of the bent portions 15 fits into the socket portion 4, both a front surface and a rear surface of the bent portion 15 abut against opposing inner wall surfaces of the socket portion (projecting portion) 4, and the bent portion 15 is sandwiched by the projecting portion. As a result, misalignment of the optical waveguide unit W with respect to the electric circuit unit E is prevented with greater reliability, and the alignment between the core 2 and the optical element 10 may be maintained with greater reliability.

The opto-electric hybrid board is manufactured through the following steps (1) to (3):
(1) a step of manufacturing the optical waveguide unit W (see FIGS. 4A to 4D and FIG. 5);
(2) a step of manufacturing the electric circuit unit E (see FIGS. 6A to 6C and FIGS. 7A to 7C); and
(3) a step of coupling the optical waveguide unit W to the electric circuit unit E (see FIG. 8).

<(1) Step of Manufacturing Optical Waveguide Unit W>

The step of manufacturing the optical waveguide unit W of the above-mentioned item (1) is described. First, a plate-like base 20 (see FIG. 4A) used when the undercladding layer 1 is formed is prepared. The forming material for the base 20 is, for example, glass, quartz, silicon, a resin, or a metal. Among them, a substrate formed of a stainless steel is preferred, because a substrate formed of a stainless steel is excellent in resistance to expansion and contraction due to heat and various dimensions thereof are substantially maintained at design values in the process of manufacturing the optical waveguide unit W. Further, the thickness of the base 20 is set within a range of, for example, 20 μm to 1 mm.

Figure 4A:
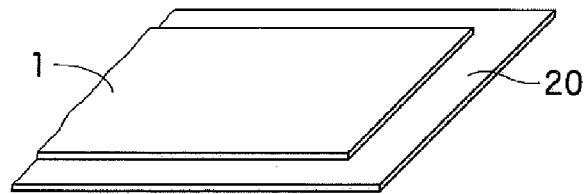
FIGS. 4A to 4D are explanatory views schematically illustrating manufacturing steps for the optical waveguide unit in a manufacturing method for the opto-electric hybrid board.

Next, as illustrated in FIG. 4A, the undercladding layer 1 is formed by photolithography in a predetermined region on a surface of the base 20. As the forming material for the undercladding layer 1, a photosensitive resin such as a photosensitive epoxy resin is used. The thickness of the undercladding layer 1 is set within a range of, for example, 5 to 50 μm.

Figure 4B:
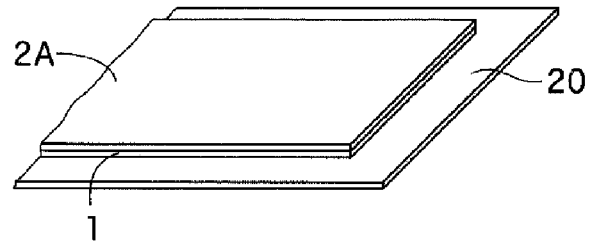

Then, as illustrated in FIG. 4B, a photosensitive resin layer 2A for forming the core and the socket portions is formed on the surface of the undercladding layer 1. Then, the photosensitive resin layer 2A is exposed to a radiation ray via a photomask formed with opening patterns corresponding to the patterns of the core 2 and the socket portions 4 which are V-shaped in plan view.

Figure 4C:
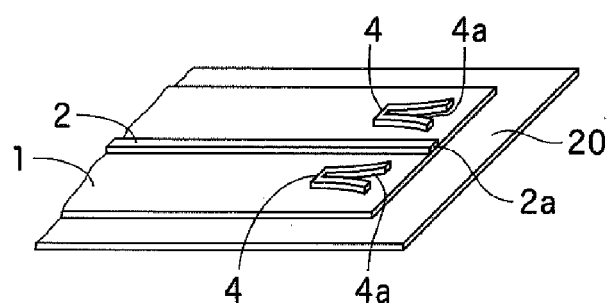

Then, as illustrated in FIG. 4C, by carrying out development using a developer, an unexposed portion of the photosensitive resin layer 2A is dissolved and removed to form the remaining portions of the photosensitive resin layer 2A into the patterns of the core 2 and the socket portions 4 which are V-shaped in plan view. As described above, the socket portions 4 are formed simultaneously with the core by photolithography using one photomask, and thus the socket portions 4 are located and formed at the predetermined locations with respect to the one end surface 2a of the core 2.

The forming material for the core 2 and the socket portions 4 is, for example, a photosensitive resin similar to the case of the undercladding layer 1, and a material having a refractive index higher than those of forming materials for the undercladding layer 1 and the overcladding layer 3 (see FIG. 4D) is used. The adjustment of the refractive index may be made by, for example, selecting the kinds of and adjusting the composition ratios of the forming materials for the undercladding layer 1, the core 2, and the overcladding layer 3. The number of the cores may be one or more than one (one in the case illustrated in FIG. 4C). The pattern of the core 2 is, for example, in the shape of a straight line, branched, or crossed, or may be a combination thereof (in the shape of a straight line in the case illustrated in FIG. 4C). The thickness of the core 2 and the socket portions 4 is set within a range of, for example, 20 to 100 μm. The width of the core 2 is set within a range of, for example, 20 to 100 μm. With regard to the dimensions of the nip portions 4a of the socket portions 4, for example, the depth is set within a range of 0.3 to 5.0 mm and the width is set within a range of 30 μm (minimum width on the valley side of the V-shape) to 2.0 mm (maximum width on the widened open side of the V-shape).

Figure 4D:
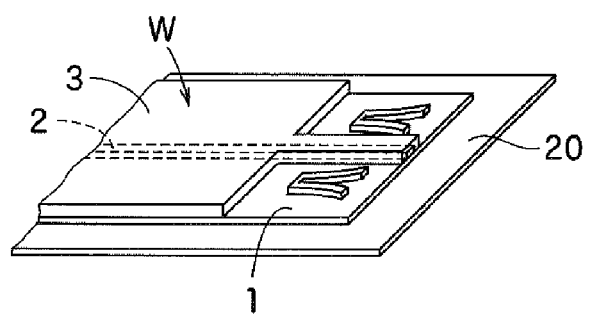

Then, as illustrated in FIG. 4D, the overcladding layer 3 is formed by photolithography on the surface of the undercladding layer 1 so as to cover the core 2 but not cover the socket portions 4. More specifically, a photomask used in forming the overcladding layer 3 is patterned so that portions corresponding to the socket portions 4 are not exposed to radiation. The forming material for the overcladding layer 3 is, for example, a photosensitive resin similar to the case of the undercladding layer 1. The thickness of the overcladding layer 3 (thickness from the surface of the undercladding layer 1) is set within a range of, for example, a thickness greater than the thickness of the core 2 and a thickness of 1,000 μm or smaller.

Figure 5:
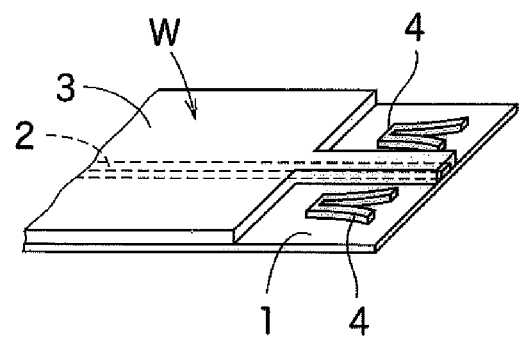
FIG. 5 is an explanatory view schematically illustrating the manufactured optical waveguide unit.

Then, as illustrated in FIG. 5, the base 20 (see FIG. 4D) is separated from a rear surface of the undercladding layer 1. With the separation, the optical waveguide unit W is obtained, which includes the undercladding layer 1, the core 2, and the overcladding layer 3 and which has the socket portions 4 for locating the electric circuit unit formed on the surface of the undercladding layer 1. The thickness of the optical waveguide unit W is set within a range of, for example, 30 to 1,150 μm. In this way, the step of manufacturing the optical waveguide unit W of the above-mentioned item (1) is completed.

<(2) Step of Manufacturing Electric Circuit Unit E>

Next, the step of manufacturing the electric circuit unit E of the above-mentioned item (2) is described with reference to FIGS. 6A to 6C and FIGS. 7A to 7C. Each of FIGS. 6A to 6C and 7A to 7C has two figures, one above the other, and the upper ones are plan views while the lower ones are longitudinal sectional views, respectively.

First, the substrate 11 (see FIG. 6A) is prepared. The forming material for the substrate 11 is, for example, a metal or a resin. Among them, a substrate formed of a stainless steel is preferred from the viewpoint of easy processability and dimensional stability. Further, the thickness of the substrate 11 is set within a range of, for example, 0.02 to 0.1 mm.

Figure 6A:
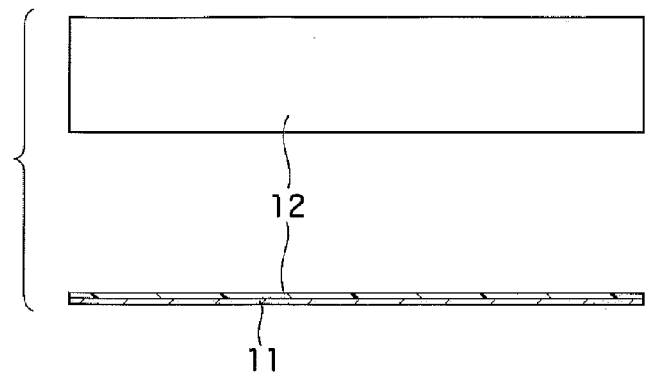
FIGS. 6A to 6C are explanatory views schematically illustrating manufacturing steps for the electric circuit unit in the manufacturing method for the opto-electric hybrid board.

Then, as illustrated in FIG. 6A, an insulating layer 12 is formed in a predetermined region of the surface of the substrate 11. With regard to the formation of the insulating layer 12, for example, varnish in which a photosensitive resin such as a photosensitive polyimide resin for forming an insulating layer is dissolved in a solvent is applied, and then, as necessary, the layer formed by applying the varnish is dried by heating treatment to form a photosensitive resin layer for forming the insulating layer. Then, by exposing the photosensitive resin layer to a radiation ray such as an ultraviolet ray via a photomask, the insulating layer 12 in a predetermined shape is formed. The thickness of the insulating layer 12 is set within a range of, for example, 5 to 15 μm.

Figure 6B:
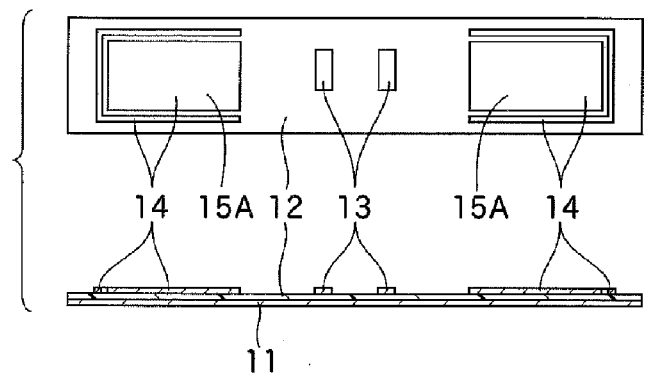

Then, as illustrated in FIG. 6B, the electric circuit (not shown) including the pad 13 for mounting the optical element, and bent portion locating circuits are simultaneously formed on a surface of the insulating layer 12, to thereby manufacture an electric circuit board. The formation of the electric circuit and the like is carried out by, for example, a semi-additive process.

More specifically, first, a metal layer (having a thickness of about 60 to 260 nm) is formed on the surface of the insulating layer 12 by sputtering, electroless plating, or the like. The metal layer becomes a seed layer when electrolytic plating is applied later (layer to be a base metal when an electrolytic plating layer is formed). Then, after dry film resists are adhered to both surfaces of a laminate including the substrate 11, the insulating layer 12, and the seed layer, hole portions of the pattern of the electric circuit and the like are simultaneously formed by photolithography in the dry film resist on a side having the seed layer formed thereon, and surface portions of the seed layer are exposed at the bottom of the hole portions. Then, an electrolytic plating layer (having a thickness of about 5 to 20 μm) is stacked by electrolytic plating on the surface portions of the seed layer exposed at the bottom of the hole portions. Then, the dry film resists are separated by a sodium hydroxide solution or the like. After that, portions of the seed layer which do not have the electrolytic plating layer formed thereon are removed by soft etching, and a stacked portion including the remaining electrolytic plating layer and the seed layer thereunder is formed into the electric circuit and the like. In this way, the electric circuit board is obtained, which includes the substrate 11, the insulating layer 12, the electric circuit including the pad 13 for mounting the optical element, and the bent portion locating circuits 14.

Figure 6C:
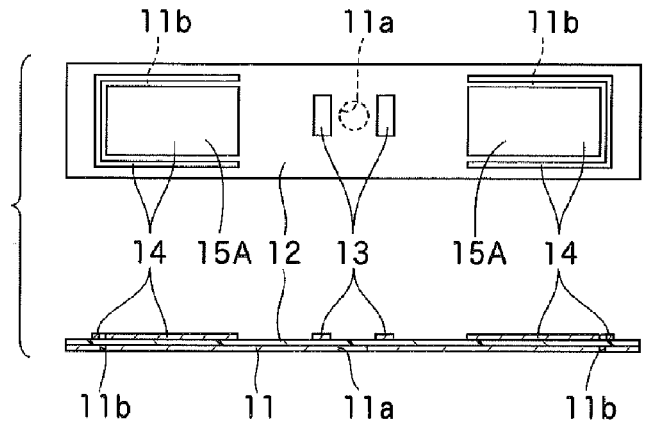

Then, the electric circuit board is set in an exposure machine, and an image of a front surface side (electric circuit side) and an image of a rear surface side (substrate 11 side) are taken by a camera. Based on the images, the locations of expected bent portion forming portions (tongue portions 15A) on the rear surface side are appropriately located with the bent portion locating circuits 14 on the front surface side being used as guides, and, the location of an expected through hole forming portion for the optical path on the rear surface side is appropriately located with the pad 13 for mounting the optical element being used as a guide. Then, the rear surface side except for expected U-shaped cut forming portions for forming the tongue-like expected bent portion forming portions and the expected circular through hole forming portion for the optical path is covered with a dry film resist (not shown). Next, as illustrated in FIG. 6C, the exposed portions of the substrate 11 at the expected U-shaped cut forming portions and at the expected circular through hole forming portion for the optical path are removed by etching using a ferric chloride solution. The etching exposes the portions of the insulating layer 12 from portions 11a and 11b removed by the etching.

Figure 7A:
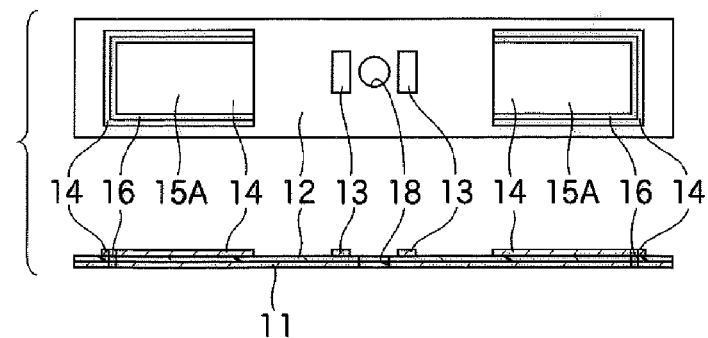
FIGS. 7A to 7C are explanatory views schematically illustrating manufacturing steps for the electric circuit unit subsequent to those illustrated in FIG. 6.

Then, as illustrated in FIG. 7A, the exposed portions of the insulating layer 12 are removed by etching using a chemical etchant. The etching forms the expected U-shaped cut forming portions into U-shaped cuts 16 (U-shaped through openings), and further, forms the expected circular through hole forming portion into the circular through hole 18. Then, by performing electrolytic plating processing, a plating layer (not shown) is formed on surfaces of the electric circuit including the pad 13 for mounting the optical element and the bent portion locating circuits 14. After that, the dry film resist is separated by a sodium hydroxide solution or the like. Note that, examples of the component of the plating layer include gold, nickel, or the like. Further, the thickness of the plating layer is ordinarily set within a range of, for example, 0.2 to 0.5 µm.

Figure 7B:
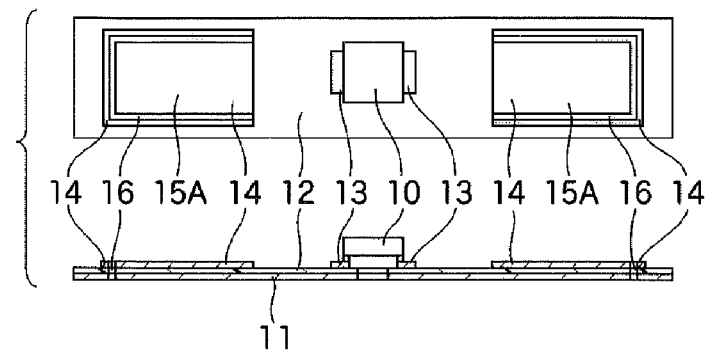

Then, as illustrated in FIG. 7B, the optical element 10 is mounted on the surface of the pad 13 for mounting the optical element via the plating layer. After that, as necessary, the optical element 10 and portions therearound are encapsulated in resin (not shown).

Figure 7C:
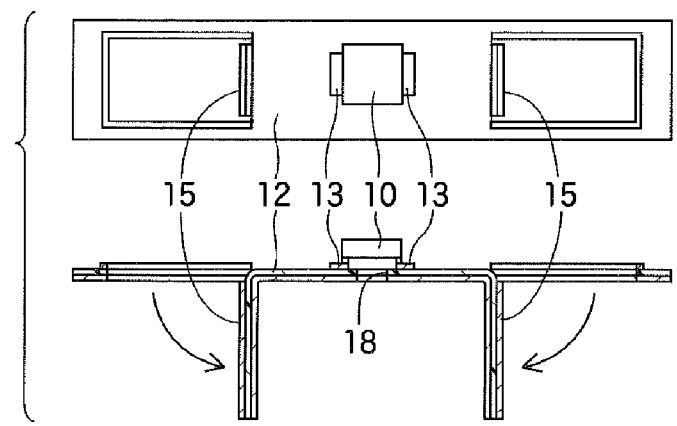

Then, as illustrated in FIG. 7C, each of the tongue portions 15A surrounded by the U-shaped cuts 16 (see FIG. 7A), respectively, is bent down so as to project perpendicularly to the electric circuit board to be formed into the bent portion 15. In this way, the electric circuit unit E having the bent portions 15 is obtained. The bent portions 15 are formed with reference to the bent portion locating circuits 14 which are formed simultaneously with the pad 13 for mounting the optical element by the semi-additive process, and thus the bent portions 15 are located and formed at predetermined locations with respect to the pad 13 for mounting the optical element. Therefore, the optical element 10 mounted on the pad 13 for mounting the optical element and the bent portions 15 are in a positional relationship of being located with respect to each other. Note that, the height of the bent portions 15 is set so that the bent portions 15 may fit into the socket portions 4 (see FIG. 1) of the optical waveguide unit. In this way, the step of manufacturing the electric circuit unit E of the above-mentioned item (2) is completed.

<(3) Step of Coupling Optical Waveguide Unit W and Electric Circuit Unit E>

Figure 8:
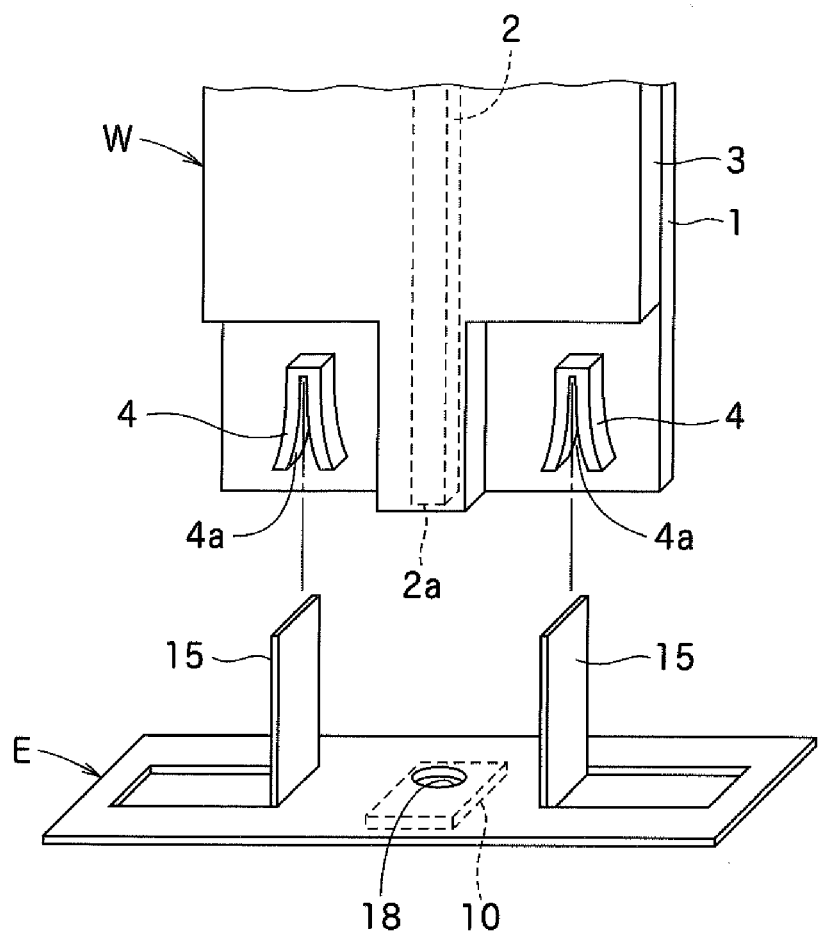
FIG. 8 is an explanatory view schematically illustrating a manufacturing step for the opto-electric hybrid board.

Next, the step of coupling the optical waveguide unit W and the electric circuit unit E is described. In this coupling, in a state in which the through hole 18 for the optical path of the electric circuit unit E and the one end surface 2a of the core 2 of the optical waveguide unit W are caused to be opposed to each other as illustrated in FIG. 8 as a perspective view (the electric circuit unit E illustrated in FIG. 7C is turned upside down), the bent portions 15 of the electric circuit unit E are caused to fit into the socket portions 4 of the optical waveguide unit W, respectively, to integrate the optical waveguide unit W and the electric circuit unit E. Here, the one side edges of the bent portions 15 are caused to be in contact with the surface portion of the undercladding layer 1 positioned in the nip portions 4a of the socket portions 4, respectively. After that, as necessary, fitting portions of the socket portions 4 and the bent portions 15 are fixed with an adhesive. In this way, the step of coupling the optical waveguide unit W and the electric circuit unit E of the above-mentioned item (3) is completed, and the opto-electric hybrid board is completed which is the goal.

Here, as described above, in the optical waveguide unit W, the one end surface 2a of the core 2 and the socket portions 4 for locating the electric circuit unit are in a positional relationship of being located with respect to each other. Further, in the electric circuit unit E having the optical element 10 mounted thereon, the optical element 10 and the bent portions 15 which fit into the socket portions 4, respectively, are in a positional relationship of being located with respect to each other. Therefore, when the bent portions 15 are caused to fit into the socket portions 4, respectively, as described above to manufacture the opto-electric hybrid board, the one end surface 2a of the core 2 and the optical element 10 are automatically aligned. As a result, in manufacturing the opto-electric hybrid board, an aligning operation which takes time and effort is not necessary. In other words, the opto-electric hybrid board is excellent in mass-productivity.

In addition, the socket portions 4 of the optical waveguide unit W are formed of the forming material of the core 2 on the surface of the undercladding layer 1 which forms the optical waveguide unit W. Further, the bent portions 15 of the electric circuit unit E are formed of a part of the electric circuit board which forms the electric circuit unit E. In other words, an additional component such as a connector is not provided for the purpose of fitting the bent portions 15 into the socket portions 4. Therefore, in the coupling between the optical waveguide unit W and the electric circuit unit E, there is no accumulation of dimensional deviations and misalignments due to an additional component such as a connector, and the core 2 of the optical waveguide unit W and the optical element 10 of the electric circuit unit E are aligned with high accuracy. Further, an additional component such as a connector is not necessary for fitting the bent portions 15 into the socket portions 4, and thus control of the dimensional accuracy of the connector or the like is not necessary. In this regard, also, the opto-electric hybrid board is excellent in mass-productivity.

Figure 9A:
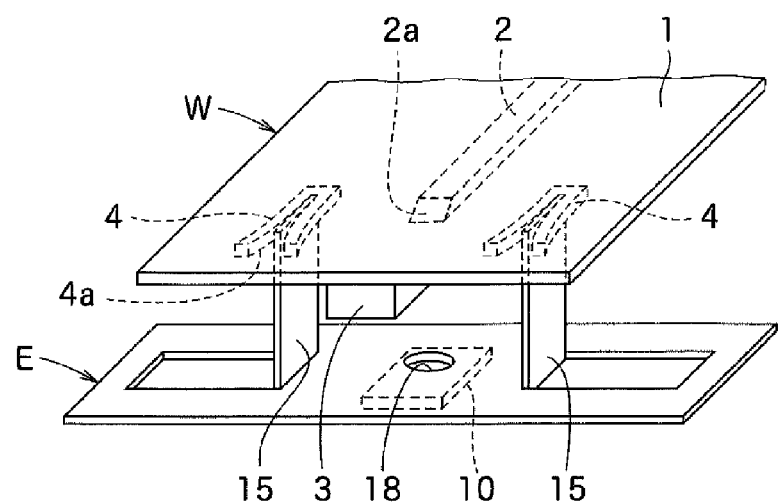
FIG. 9A is a perspective view schematically illustrating another embodiment of the opto-electric hybrid board.
Figure 9B:
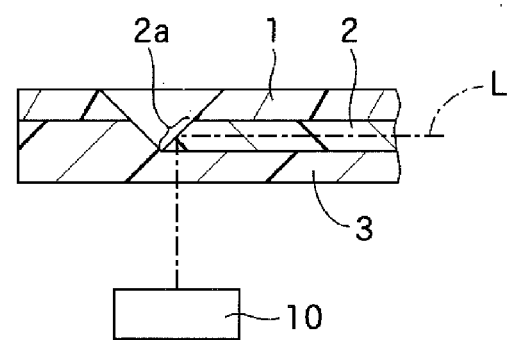
FIG. 9B is an enlarged longitudinal sectional view of a principal part of one end illustrated in FIG. 9A.

FIG. 9A is a perspective view schematically illustrating another embodiment of the opto-electric hybrid board, and FIG. 9B is a longitudinal sectional view of a principal part of one end illustrated therein. In this embodiment, in a state in which the optical waveguide unit W and the electric circuit unit E are parallel with each other, the bent portions 15 of the electric circuit unit E fit into the socket portions 4 of the optical waveguide unit W, respectively. In this fitting state, top end edges of the bent portions 15 are brought into contact with the surface portion of the undercladding layer 1 positioned in the nip portions 4a of the socket portions 4, respectively. Further, an inclined surface which is inclined 45° with respect to an axial direction of the core 2 is formed at one end of the optical waveguide unit W. The one end surface 2a of the core 2 which is positioned at the inclined surface is a light reflecting surface. More specifically, the one end surface 2a of the core 2 reflects light so that the light may be transmitted between the core 2 and the optical element 10 (see a dot-and-dash line L in the figure). The inclined surface is formed, for example, by cutting using a rotary blade, laser processing, or the like in a last step of the manufacturing steps for the optical waveguide unit W at a predetermined location with reference to the socket portions 4. Other portions of the optical waveguide unit W and the electric circuit unit E are similar to those of the embodiment illustrated in FIG. 1, and like reference numerals are used to designate like members. Actions and effects similar to those of the embodiment illustrated in FIG. 1 are produced.

Figure 10:
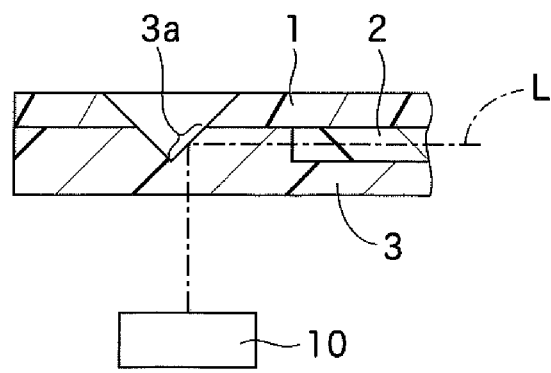
FIG. 10 is an enlarged longitudinal sectional view schematically illustrating a modification example of the one end of the optical waveguide unit of the another embodiment.

Note that, in this embodiment, at the inclined surface of the one end surface of the optical waveguide unit W, the one end surface 2a of the core 2 which is positioned at the inclined surface is formed into the light reflecting surface, but, as illustrated in FIG. 10 as a longitudinal sectional view of a principal part of the one end, an inclined surface may be formed at one end of the overcladding layer 3 and a portion 3a of the overcladding layer 3 which is positioned at the inclined surface may be formed as a light reflecting surface so that light may be transmitted between the core 2 and the optical element 10 (see a dot-and-dash line L in the figure). More specifically, also in this case, the one end surface 2a of the core 2 and the socket portions 4 (see FIG. 9A) are in a positional relationship of being located with respect to each other, and the one end surface 2a of the core 2 is aligned with the optical element 10.

Figure 11:
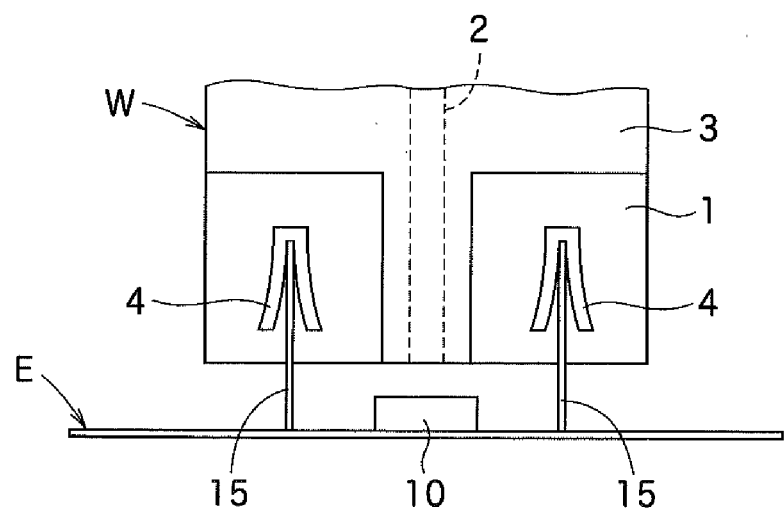
FIG. 11 is a front view schematically illustrating still another embodiment of the opto-electric hybrid board.

Further, in the above-mentioned respective embodiments, an element of the flip chip type is used as the optical element 10, but an element of a wire bonding type may also be used. When such an element of a wire bonding type is used, the light-emitting portion or the light-receiving portion is formed on an upper surface (front surface) of the optical element 10, and thus, as illustrated in FIG. 11, the optical waveguide unit W is fitted onto the electric circuit unit E from the side on which the optical element 10 is mounted.

Further, in the above-mentioned respective embodiments, description is made with regard to one end of the opto-electric hybrid board, but the other end may have a structure which is similar to that of the one end of the above-mentioned respective embodiments. In this case, as the optical element 10, by, for example, mounting a light-emitting element on the one end side and mounting a light-receiving element on the other end side, light from the light-emitting element may be received by the light-receiving element via the core 2.

Further, in the above-mentioned respective embodiments, the socket portions 4 of the optical waveguide unit W are V-shaped, but the socket portions 4 of the optical waveguide unit W may be otherwise shaped. For example, the socket portions 4 of the optical waveguide unit W may be Y-shaped (being Y-shaped is included in being substantially V-shaped), or may be U-shaped.

Further, in the above-mentioned respective embodiments, the overcladding layer 3 of the optical waveguide unit W is formed by photolithography, but the overcladding layer 3 may be formed by molding. Note that, in the above-mentioned respective embodiments, the overcladding layer 3 is formed in the optical waveguide unit W, but, as necessary, the core 2 may be in an exposed state without formation of the over cladding layer 3.

Further, in the above-mentioned respective embodiments, in the step of manufacturing the electric circuit unit E, the plating layer is formed on the surfaces of the pad 13 for mounting the optical element, the electric circuit, and the bent portion locating circuits 14, but the plating layer is formed as necessary, and is not required to be formed when unnecessary.

Next, examples are described. However, the present invention is not limited to the examples.

EXAMPLES

<Forming Materials for Undercladding Layer and Overcladding Layer>

Component A: epoxy resin including an alicyclic skeleton (EHPE3150 manufactured by Daicel Chemical Industries Ltd.) 100 parts by weight Component B: photoacid generator (CPI-200K manufactured by San-Apro Ltd.) 2 parts by weight By dissolving those Components A and B in cyclohexanone, the undercladding layer and overcladding layer forming material (photosensitive resin) was prepared.

<Forming Material for Core>

Component C: o-cresol novolak glycidyl ether (YDCN-700-10 manufactured by Nippon Steel Chemical Co., Ltd.) 100 parts by weight This Component C and 1 part by weight of the above-mentioned Component B were dissolved in ethyl lactate to prepare the core forming material (photosensitive resin).

Example 1

<Manufacture of Optical Waveguide Unit>

The above-mentioned undercladding layer, core, and overcladding layer forming materials were used to manufacture the optical waveguide unit having the V-shaped socket portions for locating the electric circuit unit similarly to the case of the above-mentioned embodiment illustrated in FIG. 1. With regard to the dimensions of the V-shaped nip portions, the depth was 1.98 mm, the minimum width on the valley side of the V-shape was 80 μm, the maximum width on the widened open side of the V-shape was 820 μm, and the center-to-center distance between the adjacent socket portions was 6.0 mm.

<Manufacture of Electric Circuit Unit>

In a similar way to the case of the above-mentioned embodiment illustrated in FIG. 1, the electric circuit unit having the rectangular bent portions which fit into the socket portions for locating the electric circuit unit, respectively, was manufactured. With regard to the dimensions of the bent portions, the width was 3.0 mm, the height was 2.0 mm, and the center-to-center distance between the bent portions which face each other was 6.0 mm. Note that, as the optical element, a light-emitting element of a flip chip type (ULM850-10-TT-00104U manufactured by U-L-M Photonics) was mounted.

<Manufacture of Opto-electric Hybrid Board>

The bent portions of the electric circuit unit were caused to fit into the socket portions of the optical waveguide unit to integrate the optical waveguide unit and the electric circuit unit. Then, the fitting portions were fixed with an adhesive.

Example 2

<Manufacture of Optical Waveguide Unit>

The one end of the optical waveguide unit of Example 1 above was formed into the inclined surface in a similar way to the embodiment illustrated in FIGS. 9A and 9B. Other portions of Example 2 were similar to those of Example 1.

<Manufacture of Electric Circuit Unit>

The electric circuit unit of Example 1 was prepared.

<Manufacture of Opto-Electric Hybrid Board>

In a state in which the optical waveguide unit and the electric circuit unit were parallel with each other, the bent portions of the electric circuit unit were caused to fit into the socket portions of the optical waveguide unit, respectively, to integrate the optical waveguide unit and the electric circuit unit. Then, the fitting portions were fixed with an adhesive.

<Light Propagation Test>

A current was caused to flow through the light-emitting element of the opto-electric hybrid board of each of Examples 1 and 2 and light was caused to exit from the light-emitting element. It was confirmed that light exited from the other end of the core of the opto-electric hybrid board.

Example 3

<Manufacture of Optical Waveguide Unit>

An optical waveguide unit was manufactured, which was the optical waveguide unit of Example 1 with the other end having, similarly to the one end, the V-shaped socket portions for locating the electric circuit unit. Other portions of Example 3 were formed similarly to those of Example 1.

<Manufacture of Electric Circuit Unit>

An electric circuit unit similar to the one in Example 1 was manufactured. Further, the electric circuit unit formed was the electric circuit unit in Example 1 having, instead of the light-emitting element, a light-receiving element of a flip chip type (PDCA04-70-GS manufactured by Albis Optoelectronics) mounted thereon.

<Manufacture of Opto-electric Hybrid Board>

Similarly to the case of Example 1, the electric circuit unit having the light-emitting element mounted thereon was fixed to the one end of the optical waveguide unit and the electric circuit unit having the light-receiving element mounted thereon was fixed to the other end of the optical waveguide unit.

Example 4

<Manufacture of Optical Waveguide Unit>

An optical waveguide unit was manufactured, which was the optical waveguide unit of Example 2 with the other end, similarly to the one end, formed into the inclined surface. Other portions of Example 4 were formed similarly to those of Example 2.

<Manufacture of Electric Circuit Unit>

The electric circuit unit having the light-emitting element mounted thereon and the electric circuit unit having the light-receiving element mounted thereon of Example 3 were prepared.

<Manufacture of Opto-Electric Hybrid Board>

Similarly to the case of Example 2, the electric circuit unit having the light-emitting element mounted thereon was fixed to the one end of the optical waveguide unit and the electric circuit unit having the light-receiving element mounted thereon was fixed to the other end of the optical waveguide unit.

<Signal Transmission Test>

A current was caused to flow through the light-emitting element of the opto-electric hybrid board of each of Examples 3 and 4, and light was caused to exit from the light-emitting element. It was confirmed that the light was received by the light-receiving element.

From the results of Examples 1 to 4 above, it can be found that, in the manufacturing method described above, even without an aligning operation of the core of the optical waveguide unit and the optical element (light-emitting element or light-receiving element) of the electric circuit unit, the obtained opto-electric hybrid board may appropriately propagate light.

Note that, a result was obtained that the opto-electric hybrid board in which the socket portions were Y-shaped or U-shaped could also appropriately propagate light even without an aligning operation.

The opto-electric hybrid board according to the present invention may be used in an information-communication device, a signal processing device, or the like, which transmits and processes at high speed a digital audio signal, a digital image signal, or the like.

Although specific forms of embodiments of the instant invention have been described above and illustrated in the accompanying drawings in order to be more clearly understood, the above description is made by way of example and not as a limitation to the scope of the instant invention. It is contemplated that various modifications apparent to one of ordinary skill in the art could be made without departing from the scope of the invention.

What is claimed is:

1. An opto-electric hybrid board, comprising:
   an optical waveguide unit; and
   an electric circuit unit having an optical element mounted thereon, the electric circuit unit being coupled to the optical waveguide unit,
   wherein the optical waveguide unit comprises:
      an undercladding layer; and
      a core for an optical path and a socket portion for locating the electric circuit unit, the core and the socket portion being formed on a surface of the undercladding layer, the socket portion being formed of the same material as a forming material for the core;
   wherein the electric circuit unit comprises:
      an electric circuit board;
      the optical element mounted at a predetermined portion on the electric circuit board; and
      a bent portion formed by bending a part of the electric circuit board so as to stand upright, for fitting into the socket portion;
   wherein the socket portion of the optical waveguide unit is located at a predetermined location with reference to a location at which the core is formed with respect to one end surface of the core;
   wherein the socket portion is capable of nipping;
   wherein the bent portion of the electric circuit unit is located and formed at a predetermined location with respect to the optical element; and
   wherein the optical waveguide unit and the electric circuit unit are coupled to each other in a state in which the bent portion of the electric circuit unit fits into the socket portion of the optical waveguide unit.

2. The opto-electric hybrid board according to claim 1, wherein the socket portion of the optical waveguide unit is a projecting portion which is substantially V-shaped in plan view, and
   wherein the bent portion of the electric circuit unit fits into the projecting portion in a state of being sandwiched between substantially V-shaped opposing inner wall surfaces of the projecting portion.

3. A manufacturing method for an opto-electric hybrid board in which an optical waveguide unit and an electric circuit unit having an optical element mounted thereon are coupled, the method comprising:
   manufacturing the optical waveguide unit comprising:
      forming an undercladding layer; and
      forming, on a surface of the undercladding layer, a core for an optical path and a socket portion for locating the electric circuit unit, the forming of the core and the socket portion comprising forming, by photolithography, the socket portion for locating the electric circuit unit simultaneously with the forming of the core, the socket portion being formed of the same material as a forming material for the core, at a predetermined location located with respect to one end surface of the core;

manufacturing the electric circuit unit comprising:
   forming an electric circuit board;
   mounting the optical element at a predetermined portion on the electric circuit board; and
   forming, after the mounting the optical element, a bent portion for fitting into the socket portion by bending so as to stand upright at a predetermined location with respect to the optical element; and coupling the optical waveguide unit and the electric circuit unit, the coupling comprising fitting the bent portion of the electric circuit unit into the socket portion of the optical waveguide unit.

4. The manufacturing method for an opto-electric hybrid board according to claim 3,
   wherein the forming of the socket portion comprises forming the socket portion to be a projecting portion which is substantially V-shaped in plan view, and
   wherein the fitting the bent portion comprises causing the bent portion of the electric circuit unit to be sandwiched between substantially V-shaped opposing inner wall surfaces of the projecting portion.

\* \* \* \* \*